United States Patent [19]

Kotera et al.

[11] 4,177,372
[45] Dec. 4, 1979

[54] METHOD AND APPARATUS FOR LASER ZONE MELTING

[75] Inventors: Nobuo Kotera, Kokubunji, Japan; Tetsu Oi, Waltham, Mass.; Takashi Nishida, Tokyo, Japan

[73] Assignee: Hitachi, Ltd., Japan

[21] Appl. No.: 799,928

[22] Filed: May 24, 1977

[30] Foreign Application Priority Data

May 26, 1976 [JP] Japan .................. 51-60012

[51] Int. Cl.[2] .............................................. B23K 9/00
[52] U.S. Cl. ........................ 219/121 L; 219/121 LM
[58] Field of Search ....... 29/610; 219/121 L, 121 LM, 219/121 EM

[56] References Cited

U.S. PATENT DOCUMENTS

| | | | |
|---|---|---|---|
| 3,287,107 | 11/1966 | Eaton | 13/31 X |
| 3,699,649 | 10/1972 | McWilliams | 29/610 |
| 3,848,104 | 11/1974 | Locke | 219/121 L |
| 3,986,391 | 10/1976 | Vahaviolos | 219/121 LM |

*Primary Examiner*—J. V. Truhe
*Assistant Examiner*—Fred E. Bell
*Attorney, Agent, or Firm*—Craig and Antonelli

[57] ABSTRACT

A method for laser zone melting and apparatuses therefor wherein, in a zone melting method for a thin film due to the irradiation of laser beam, the laser beam is vibrated at the frequency of more than 1 Hz in the direction substantially perpendicular to the moving direction of a melting zone and the fluctuation of laser beam output is controlled to less than 1%. The zone-melted thin films manufactured by this method have good electrical properties resulting from less crystal imperfection, less non-stoichiometric excess atoms of the constituents, and less thickness corrugation of the film due to the suppression of temperature fluctuations and its spacial inhomogeneity at the time of zone melting.

20 Claims, 3 Drawing Figures

METHOD AND APPARATUS FOR LASER ZONE MELTING

BACKGROUND OF THE INVENTION

1. Field of the Invention

This invention relates to a zone melting method by means of laser, and particularly to a zone melting method wherein high temperature-gradient is built up on a thin film or semiconductor thin film due to the irradiation of laser beam to carry out the zone melting, and the surface roughness of the thin film after the zone melting can be minimized. In addition, this invention also relates to a zone melting apparatus to be used in the aforementioned zone melting method.

2. Brief Description of the Prior Art

In the past, it was well known that the zone melting can be performed by locally melting the semiconductor thin film such as InSb on a substrate by use of laser beams. One example is reported in the literature "R. Traniello Gradassi, ALTA FREQUENZA, n.7 vol XLIV-1975, page 350-353".

According to the above-mentioned zone melting method, the grains of the crystallites are generally made coarse and the removing of impurities is also conducted, so that the thin film of InSb having a property like single crystals can be obtained. In this case, if infrared rays emitted by a $CO_2$ laser and the like are used, the zone melting of the InSb thin film can be readily carried out even under a high temperature-gradient ranging from 400° C./cm to 2000° C./cm.

The zone melting under a high temperature-gradient $dT/dx$ in the direction (x direction) along which the melting zone travels results in the effective refining of the crystallite by the segregation of native impurities and also in the elimination of voids and defects and others, so that highly-pure semiconductor thin films without crystal imperfection will easily be obtained.

In gaseous lasers using molecules such as $CO_2$, CO, $H_2O$ or HCN, which generally require a high voltage power source, there is the fluctuation of laser-output P in the range of 1-5% with the frequency of several hertz to several hundreds hertz. As the result, the temperature in the melting zone during the zone melting process will fluctuate in the range of about 5°-25° C. for 525° C. (melting point of InSb crystal), and about 14°-70° C. for 1410° C. (melting point of Si crystal). This phenomenon is enhanced by the fact that the heat capacity and the volume to be melted in the case of the thin film semiconductor is extremely small (e.g. 100 $\mu m \times 10mm \times 1mm$) in contrast to the case of the zone-melting of bulk semiconductors. The small volume and the resultant small heat capacity, therefore, directly lead to the temperature-fluctuation of the melting zone.

The generation of crystal imperfection and non-stoichiometric excess atoms in compound semiconductors caused by the aforementioned fluctuation of temperature T and also by the undesirable variation of temperature-gradient $dT/dx$ in the direction of zone melting (x-direction) is the first disadvantage in a conventional laser thin film zone melting apparatus.

Furthermore, the laser beam having the cross-section of 8 mm width and 5 mm length, that is concentrated on the thin film surface, will have higher energy-density at the central portion and lower energy-density at its periphery. Such inhomogeneous distribution of energy density within the beam cross-section results in the non-uniformity of temperature in the melting zone during the zone melting process. This directly leads to the undesirable temperature-gradient $dT/dy$ in the direction (y direction) perpendicular to the direction of zone-melting (x direction). In such cases, it has been found that the thickness corrugation with surface roughness ranging 0.1-10 $\mu m$ is formed on the semiconductor thin film during and after the zone melting.

Accordingly, the second disadvantage in a conventional laser thin film zone melting apparatus lies in the fact that the formation of rough surfaces, i.e. wrinkles of more than 0.1 $\mu m$, can not be avoided. The formation of such wrinkles on the surface of thin films in the course of zone-melting results in the local inhomogeneity of the temperature due to inhomogeneous heat conduction (in case of heating and cooling). This phenomenon causes non-stoichiometric excess atoms of the costituents, dislocation, crystal (point) defect, and voids within the thin film crystal.

SUMMARY OF THE INVENTION

It is therefore an object of this invention to provide a laser zone melting method and an apparatus therefor without having various disadvantages of the prior art mentioned above in which temperature fluctuations as well as its spacial inhomogeneity in the melting zone of thin film during the melting process are greatly reduced, and consequently high quality thin films or semiconductor thin films with good electrical properties are obtained.

To achieve the abovementioned object, the zone melting method according to the present invention is characterized in that the laser beam should be irradiated on the thin film, in the first place, so as to deflect oscillatorily at a frequency of more than 1 Hz in the y direction substantially perpendicular to the moving direction (x direction) of melting zone and in that the portion irradiated by the laser beam should be, in the second place, moved in the x direction relatively from one end of the thin film toward the other end thereof.

According to the method of the present invention, the non-uniformity of temperature in y direction of the melting zone in the thin film can be eliminated by deflecting oscillatorily the laser beam in y direction, and the temperature gradient $dT/dy$ in y direction can be also made almost zero.

The laser beam output to be used must be continuous, but it is preferable that the power fluctuation of laser beam can be suppressed to less than 1%.

If the deflecting frequency of laser beam in the y direction is less than 1 Hz, the non-uniformity of temperature distribution in y direction may be caused, so that some partial non-melting portion is sometimes observed undesirably, where the melting zone is homogeneously to be kept.

In principle, there exists no upper limit for the above deflecting frequency since it naturally surpasses the inverse of the thermal time constant of thin film when the frequency is heightened, but it is practically impossible to elevate its frequency without any restriction for lack of the apparatus capability. In reality, the frequency can be raised to an order of 1000 Hz, but no special effect can be expected in raising it beyond a certain limit. The center of deflection will naturally be located around the middle of the width of the thin film in y direction.

Although the output power of the laser beam necessary for melting the objective material differs depending upon material and dimensions of the thin film, upon material and dimensions of a substrate on which the thin film is formed, and upon other environmental thermal conditions, an input power to the thin film of more than 1 W, preferably 2–200 W, will be sufficient in the case of InSb thin film. This range can also be applied to thin films made of other materials. As laser beam, $CO_2$ laser is generally used because high output power is easily available as compared with others, but not limitative.

As sectional shape of laser beam, a rectangular shape or a ellipsoidal shape is most suitable, but a small circular spot laser beam that is obtained directly from a laser oscillator is also usable. For this modification of the sectional shape of laser beam, a convex cylindrical lense or concave cylindrical mirror, for example, may be used. In this case, a concave spherical mirror and a conventional slit may be commonly used. Preferably, the length in the y direction of the one-dimensionally elongated cross-section of the laser beam is such that it sufficiently covers the length in the y direction of the thin film to be zone melted. The sectional shape of beam from the laser oscillator is circular and usually has a diameter of 3–10 mm. A beam expander consisting of two convex spherical lenses or of two concave spherical mirrors may be used as means for enlarging the beam diameter. The sectional shape of laser beam will be modified to a rectangular beam or elliptical beam after having been enlarged as mentioned above. In these modifications, the shape of beam from the laser oscillator is optional and not limited to any specific shape. In addition, a horn type structure consisting of four mirrors connected side by side may be used as beam expander. As the enlarged laser beam, the beam width in the x direction is preferable to be from 0.3 mm to approximately one-fifth the length in the x direction of thin film. The lower limit will be determined by the wavelength of laser beam and at approximately 0.3 mm in the case of $CO_2$ laser and the like, but it should be noted that the abovementioned value will be a limitation in actual use. The setting of laser beam width to more than one-fifth the length of thin film is not preferable because the efficiency of zone refining is lowered. It is sufficient to set the length of the enlarged laser beam in the y direction to a value approximately equal to the width in the y direction of thin film as mentioned above.

When any commercialized laser device is used and the laser beam is not enlarged as it is, the beam is of small circular spot of 3–8 mm diameter, for example. In this case, a deflecting frequency in y direction of more than 1 Hz may be used to attain general purposes, but more than 10 Hz is more desirable.

The peak-to-peak amplitude of the deflection in the y direction of laser beam can be set to the width of thin film in its y direction. In this case, the center of beam or high energy portion will scan the y direction of thin film from one end to the other end.

As described above, in the present invention, it is desirable to suppress the power fluctuation of laser beam within 1%. In case this value exceeds 1%, undesirable temperature fluctuation $dT/dx$ arises and resulting in the generation of thickness corrugation of the film and crystal imperfection since the temperature T in the melting zone of the thin film varies with time in the direction of zone melting (x direction). This similarly applies to the case where the deflecting frequency of laser beam in the y direction is less than 1 Hz.

In the zone melting method of the present invention, the power fluctuation of laser beam is suppressed within 1% by measuring the temperature in the melting zone of thin film, by holding a voltage corresponding to its temperature in an electronic circuit, by comparing this voltage with a predetermined reference voltage, by feeding its different voltage back to a power controller in a laser generator, and by controlling the laser power so as to suppress the temperature fluctuation in the melting zone of the thin film. For the temperature measurement, optical means such as an infrared microscope or infrared TV-camera, for example, can be used. In addition, a buffer amplifier is inserted between the electronic circuit in temperature measuring system and the power controller in the laser device to attain impedance matching therebetween. Devices and electronic circuits known as prior arts can be used for this purpose.

The application of laser beam to the thin film in the x direction from one end to the other end may be made by moving either the laser beam in the x direction, or the thin film itself in the x direction.

The oscillatory deflection of laser beam in the y direction is attained by inserting a reflector in the path of beam and vibrating the reflector by mechanical means such as cam or by electromagnetic device.

It is very difficult to make the film uniform when the thickness of thin film is less than 100 Å. On the other hand, when the thickness of thin film exceeds approximately 100 μm, the generation of wrinkles as well as crystal imperfection can not be avoided because both the violent convection of the constituent atoms in the melted portion in the thickness direction and the surface tension caused by the poor wetting between the substrate surface and the melted portion enhance a tendency to agglomerate the film. In the case of the film of more than 100 μm, it may be sometimes agglomerated locally and thereby ruptured in some part where the film is absent locally. Accordingly, the method of the present invention is directed to the zone melting for a thin film having a thickness of approximately 100 Å–100 μm.

When the laser beam output P is less than 1 W, the objective thin film can not be melted in some case because of cooling through the substrate. In reality, the necessary power is in most cases 2–200 W, but must be selected in accordance with the kind of substrate on which a thin film is deposited. To expedite melting the film, the substrate may intentionally be heated from the under side thereof, though, in some cases, the cooling of the substrate may be performed through substrate holders (water cooling). In the latter, the temperature-gradient $dT/dx$ to be set at the melting zone on the semiconductor becomes strong, where a highly-pure crystal without crystal imperfection could easily be obtained. However, if the laser beam output P is too small, the thin film will not be melted. In the heating and cooling methods as mentioned above, it is a matter of course that a positional uniformity for heating and cooling must be the one to be desired.

As clearly understood from the explanation concerning the laser zone melting method of the present invention as described above, the laser zone melting apparatus according to the present invention is a device which performs the zone melting to the thin film by use of means of irradiating with the laser beam, which comprises the first means of deflecting the laser beam oscillatorily at a period of more than 1 Hz in the direction substantially perpendicular to the moving direction of melting zone and, preferably, the second means of suppressing the fluctuation of the laser beam output with time to a value less than 1%.

More specifically, the laser zone melting apparatus in accordance with the present invention comprises a chamber which can be used as a closed container, can be evacuated to vacuum and can support therein the thin film to be zone melted, a laser light source for irradiating the thin film, a electrical power source for operating the laser light source with a power controller for controlling the laser power output, an optical path for introducing the laser beam to the surface of thin film, means of deflecting the laser beam oscillatorily at a frequency of more than 1 Hz in the direction substantially perpendicular to the moving direction of melting zone of the thin film, means of moving the thin film or the laser beam relatively in the direction substantially perpendicular to the deflecting direction of laser beam, means of measuring the temperature in the melting zone of the thin film, means of holding the voltage corresponding to the measured temperature, comparing this voltage with the predetermined reference voltage to generate its difference voltage, and means of feeding the difference voltage back to the power controller.

Means of enlarging the laser beam in the y direction and others can also be added just as described previously.

The chamber accommodating the thin film to be zone melted must be so constructed that air can be exhausted just as similar to the conventional zone melting apparatus. Besides, it is desirable to be so constructed that gases can be introduced into it so as to enable the heating in the desired atmosphere.

The thin film manufactured according to the method of the present invention or by using the apparatus therefor exhibits the following benefits as compared with the thin film manufactured by the zone melting method of the prior art;

(i) Stability and uniformity of the temperature in the melting zone of the thin film are remarkably improved by deflecting the laser beam oscillatorily in the y direction. As the result, the generation of non-stoichiometric excess atoms of the constituents and crystal imperfection of the thin film are greatly reduced. Therefore, in the case of the semiconductor thin film, its electron mobility $\mu H$ and Hall coefficient $R_H$ are elevated.

(ii) Similar effects in Item (i) can also be expected by suppressing the power fluctuation of the laser beam to a range of less than 1%.

(iii) In the case of the semiconductor thin film, the electron mobility $\mu H$ is elevated as described above, so that current noise in an element using the semiconductor thin film is lowered.

(iv) Further improvement in the Hall coefficient $R_H$ of the semiconductor thin film once manufactured can be effectively accomplished by doping a certain impurity intentionally into it because the original thin film is made highly pure as described in the above items.

(v) Since the laser beam is deflected in the y direction, the zone melting can be performed even for the thin film which has a large width in the y direction.

(vi) Surface roughness of the zone-melted thin film becomes below 0.1 $\mu m$.

In addition, the laser zone melting method exhibits, generally, specific effects as follows.

(vii) A thermal source for melting is a laser light source, so that no contamination of the thin film due to the thermal source is present.

(viii) Since the laser beam is used, the zone melting to the thin film can be carried out under a strong temperature-gradient.

(ix) Any kind of gaseous atmosphere can be used as atmosphere during zone melting process.

DESCRIPTION OF THE PRESENTLY PREFERED EMBODIMENT

Figure 1:
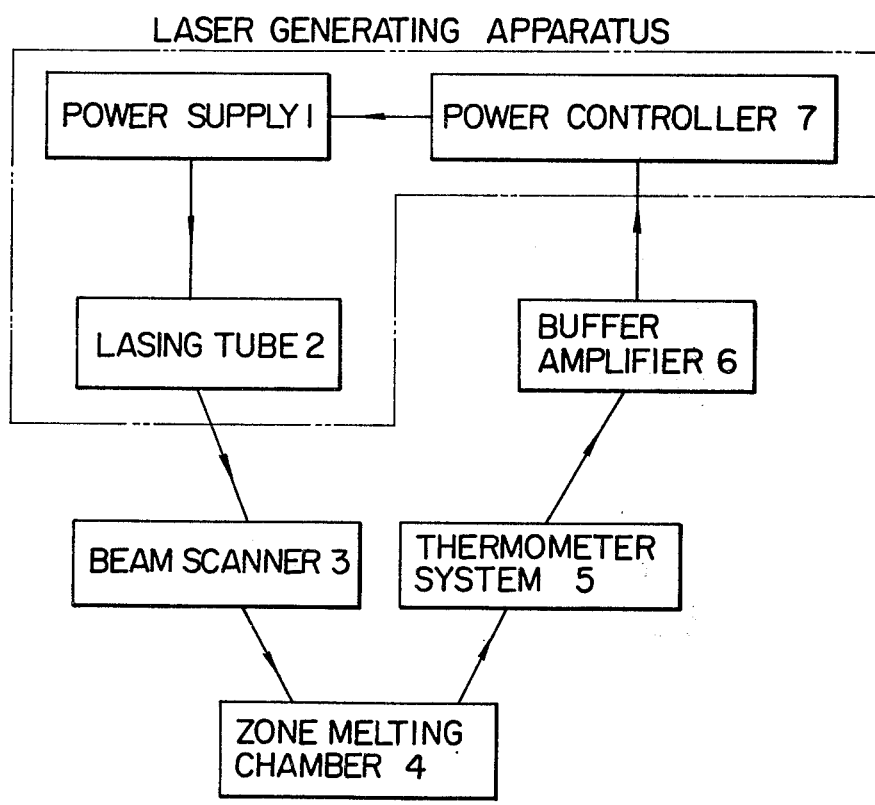
FIG. 1 is a block diagram showing the concept of a laser thin film zone melting apparatus in accordance with the present invention.

In FIG. 1, there is shown a block diagram illustrating an arrangement of the zone melting apparatus.

As a laser device, a $CO_2$ laser which generates a rated output of 40 W is used. The $CO_2$ laser is most favorable in view of large output power, but other kind of laser can be employed as well. The laser device comprises a lasing tube 2 which is generally called a $CO_2$ laser, a power supply 1 for the laser device, and a power controller 7. The light output from the $CO_2$ laser 2 is deflected oscillatorily, back and forth, by means of a beam scanner 3 which vibrates a mirror and introduced into a zone melting chamber 4 in which a thin film sample is supported. The temperature in the melting zone of the thin film sample is measured by means of a thermometer system 5 including optical means such as an infrared microscope or infrared TV-camera, for example. An electrical signal corresponding to the temperature fluctuation is fed back through a buffer amplifier 6 to the power controller 7 which can control its laser output. The power supply 1 is controlled by this signal, and the light output of the $CO_2$ laser 2 is adjusted in such manner that the temperature fluctuation in the melting zone of the thin film sample is suppressed.

Figure 3:
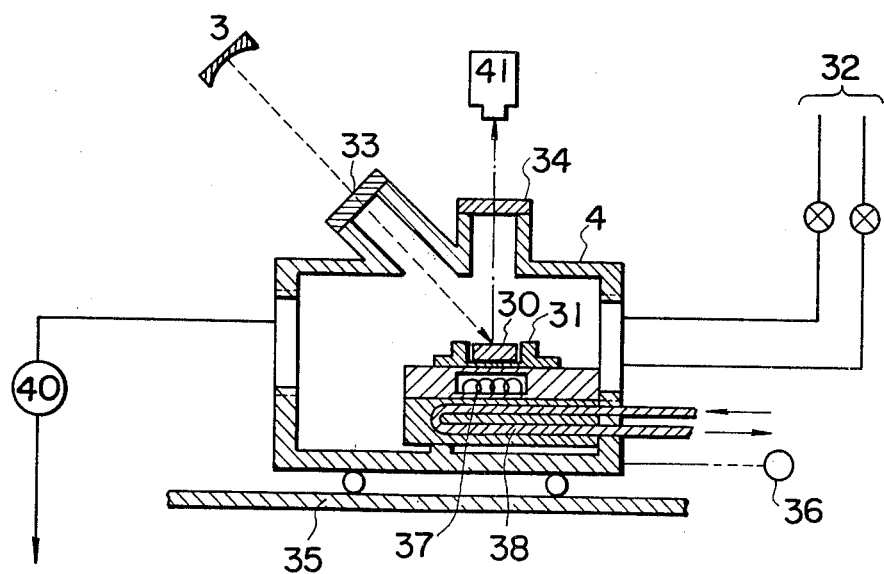
FIG. 3 shows a sectional view of a zone melting chamber for the laser zone melting apparatus in one of the embodiments of the present invention.

Refering now to FIG. 3 which shows a sectional view of the zone melting chamber 4, it is mainly constituted by a chamber including a supporting means 31 used for holding a sample piece therein. The chamber is so constructed that air can be exhausted just as similar to the conventional zone melting apparatus, and the chamber and a vacuum pump system 40 are coupled by means of a bellow because the chamber itself is to be moved, in this example. The movement of the sample piece 30 can be attained by moving either the chamber itself or the sample piece 30 in the chamber as described above. A rail 35 is used to move the chamber along the length thereof. The chamber is moved slowly by an ordinary fine driving mechanism 36 comprised of a rotating shaft, gears and a motor.

Reference numeral 32 shows a gas supply system and some kind of gas is thereby introduced into the chamber during the zone melting process. A window 33 is used to introduce the light beam from the beam scanner 3 into the chamber, and a window 34 is used to measure the temperature inside the chamber. The window 33 is made of a material such as Ge or ZnSe since the wavelength of the $CO_2$ laser is 10.6 $\mu m$, while the window 34 is made of quartz. In this embodiment, the window 34 is disposed just above the sample piece and the window 33 is diagonally installed at the upper part of the chamber, but they can be reversed or both diagonally installed. A heater 37 and a cooling pipe 38 are disposed under the sample holder.

Figure 2:
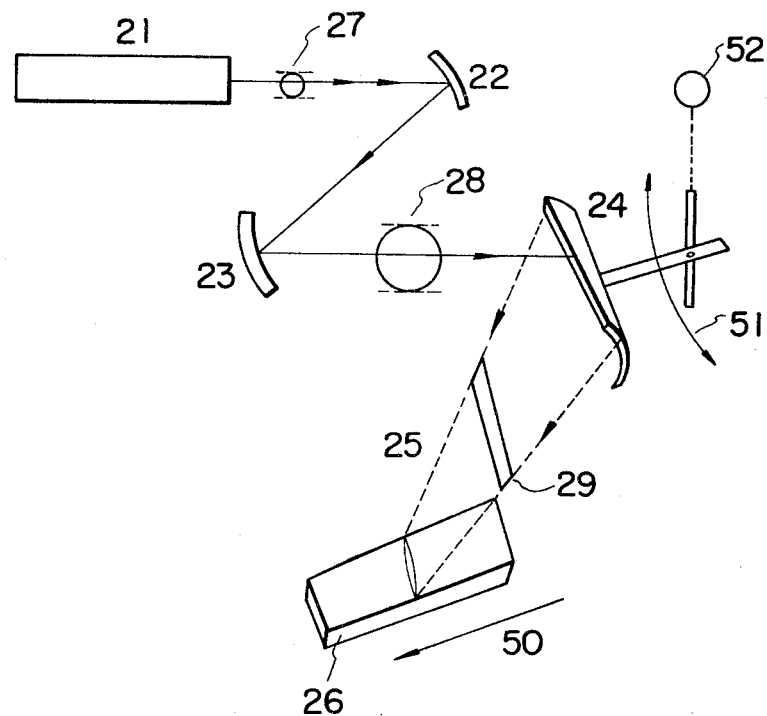
FIG. 2 shows a schematic illustration useful for explaining an optical path for introducing the laser beam, which is one preferred embodiment of the present invention.

In this paragraph, the optical path for introducing the laser beam, including the beam scanner of the zone melting apparatus, will be explained in detail in conjunction with main arrangements shown in FIG. 2. The light beam emitted from the $CO_2$ laser 21 is 8 mm in diameter, but is enlarged to 32 mm in diameter through the combination of the concave spherical mirrors 22 and 23. The enlarged beam is received by the concave cylindrical mirror 24 and thereby converted from circular shape to ellipsoidal shape in its cross-section. In short, the light output 25 of the concave cylindrical mirror 24 is an elongated light beam near a rectangle of $2\times 30$ mm. In FIG. 2, the sectional shape of laser beam viewed from the plane perpendicular to the travelling direction of light is indicated by various views represented by 27, 28 and 29. An arrow 50 shows the moving direction of the sample piece which is subject to the zone melting.

In general, it is convenient to utilize an elongated beam of $1-2$ mm$\times 20-30$ mm. The elongated beam is obtained by use of the concave cylindrical mirror 24 in this embodiment, but may be obtained by the combined structure of a concave spherical mirror and a slit formed by using water-cooled two light screening plates. Construction of the beam scanner is not limited to the one herein indicated. Instead of the concave cylindrical mirror and the concave spherical mirror, a convex cylindrical lenses may be used.

The elongated beam 25 is suited for zone-melting a semiconductor thin film of less than 30 mm in width, but the density of the light energy is high at its center portion and low at its periphery. Thus, if the elongated beam is used as it is, it causes wrinkles or corrugations on the surface of the thin film after the zone melting. To remove such disadvantage, the concave cylindrical mirror 24 is mechanically vibrated in the direction indicated by an arrow 51 in FIG. 2 and act as a beam scanner. The vibration of the mirror is made possible up to 3-10 Hz conventionally by the combination 52 of the motor and the cam in this embodiment, but may be attained by a electromagnetic force. The light-beam deflection by means of mirror vibration is carried out as such that the high energy portion at the center of the beam scans sufficiently to cover the full width of sample piece. In short, the peak-to-peak amplitude of the beam scanning on the sample surface is set to almost the same width of the sample piece. By arranging the beam scanner as described above, a uniform temperature distribution in the deflecting direction of the beam (i.e. the direction perpendicular to the direction of zone melting) could be realized at the melted portion of the thin film on the substrate 26. The zone melting to the semiconductor thin film is performed by moving the substrate 26 for the semiconductor thin film at a constant speed in the direction perpendicular to the beam scanning. In this embodiment, the chamber itself is moved and the moving speed of the substrate is made adjustable within the range of 0.1-200 $\mu$m/sec.

The temperature measurement and the feed-back to the power controller will be realized through general method as described below. The most highest temperature in the melting zone is first detected by means of an infrared TV-camera 41, where the highest temperature corresponds to the highest output voltage in the TV-video signal, for example. The voltage corresponding to the temperature level is first stored in the electronic circuit and then compared with the predetermined reference voltage to obtain its difference that is fed back to the power controller in the laser device. The buffer amplifier 6 in FIG. 1 is provided for the purpose of impedance matching between the laser device and the electronic circuit for measuring temperature, and any type of conventional buffer amplifier may be used for it. Response time in electric circuit system extending from the temperature detection infrared camera 41 to the power controller 7 is made variable, but it is so constructed as to follow at a high frequency of more than 10 Hz in consideration of a thermal time constant (approximately 0.1 sec) of the melt.

According to the laser thin film zone melting apparatus the following advantages can be expected:

(i) Relative temperature fluctuations in the melting portion of the thin film can be controlled to less than 1% due to the feed-back effects of the electrical signal corresponding to its temperature fluctuation.

(ii) Relative temperature fluctuations within the melting zone ranging about 30 mm in the beam-deflecting direction can be controlled to less than 1% due to the high-speed oscillatory deflection effects of the elongated light beam through the beam scanner, and uniform temperature distribution can be thereby obtained within the melting zone.

The outcomes of zone melting to the compound semiconductor InSb by use of the present device will be hereinafter described.

Helium (He) gas was supplied at a rate of 2.0 l/min into the chamber, and the laser output was adjusted so that the melting zone in the thin film is heated to 710° C. max. by use of the irradiated laser beam. InSb thin film used was obtained by depositing InSb in 0.2 $\mu$m thickness on the sapphire substrate of 30 mm$\times$30 mm, and coating $Al_2O_3$ glass film of 0.8 $\mu$m thickness on the InSb film according to the CVD (chemical vapor deposition) method due to thermal decomposition of aluminum isopropoxid. Similarly, the thin film obtained by depositing InSb in 6 $\mu$m thickness on the sapphire plate of 30 mm$\times$30 mm and then providing thereon with $In_2O_3$ film of 0.1 $\mu$m thickness was used. Upon the zone melting, moving speed for the sample piece, zone width, and deflecting frequency of laser beam were set to 5 $\mu$m/sec, 0.8 mm, and 10 Hz, respectively. In addition, the zone melting was exercised at deflecting frequencies of 1.5 and 30 Hz, but almost the same results were obtained. After the zone melting, it turned out that there were no wrinkles and agglomeration on the InSb film on the substrate and the flatness within 0.1 $\mu$m/30 mm was assured. For the electrical measurement, InSb films of a Hall-element shape was formed by removing $Al_2O_3$ or $In_2O_3$ film on the InSb film through etching or mechanical grinding and then applying a photo-etching to the InSb film. As the result of Hall effect measurement, it was found that Hall coefficients $R_H$ and electron mobilities $\mu H$ at room temperature were 350 cm$^3$/C and 5500 cm$^2$/V sec, respectively, for 0.2 $\mu$m thick InSb film, and 330 cm$^3$/C and 69,300 cm$^2$/V sec, respectively, for 6 $\mu$m thick InSb film. It means that a high quality thin film crystal was obtained because the value of electron mobility indicated above is extremely large for the InSb thin film. Incidentally, it has been known that the electron mobility for a single crystal InSb is 78,000 cm$^2$/V sec, and the value of 69,300 cm$^2$/V sec can be regarded to be almost identical there-with. According to scientific literatures, it has been reported that the value of $\mu H$ in the case of the thickness of 0.2 $\mu m$ will become one-several tenth the value of single crystal, so that the value of 5500 cm$^2$/V sec shows that the crystals obtained are of high quality. If the light beam was not deflected oscillatorily in the case of the abovementioned laser thin film zone melting apparatus, the rolling of InSb film surface amounted up to $\pm 1.5$ $\mu m$ in case of 6 $\mu m$ thick InSb film beneath the In$_2$O$_3$ layer. As the result of measurement, it showed that $R_H = 330$ cm$^3$/C and $\mu H = 62,500$ cm$^2$/V sec, and the quality of the film was somewhat inferior to the former. For the purpose of comparison, the electron mobility $\mu H$ of the InSb film of 6 $\mu m$ thickness manufactured by the zone melting device utilizing a conventional hot wire method was approximately 57,000–61,000 cm$^2$/V sec. Though the present embodiment was described in connection with an example of the InSb thin film crystal, it was also applicable to Si and Ga$_x$In$_{1-x}$Sb, having the better electrical characteristics. In addition, the cross-section of laser beam is not necessarily limited to an ellipsoidal shape, but can be optionally selected according to the substrate shape so long as the thin film on the substrate can be sufficiently melted homogeneously.

What we claim is:

1. A laser zone melting method, wherein zone melting of a thin film is performed by irradiating with a laser beam and moving the laser beam relative to the thin film, in a moving direction, comprising the steps of (i) sufficiently elongating said laser beam in the direction substantially perpendicular to the moving direction of the melting zone so that the length of the beam, perpendicular to the moving direction of the melting zone, covers the width, in the direction perpendicular to said moving direction, of the thin film, and (ii) irradiating the thin film by the elongated laser beam while oscillatorily deflecting the elongated beam in a direction substantially perpendicular to the moving direction, with the peak-to-peak amplitude of the oscillation being approximately the width of the thin film in the direction perpendicular to the moving direction, and relatively moving the region irradiated by the laser beam from a first end to a second end of the thin film.

2. A laser zone melting method according to claim 1, wherein, while elongating said beam, said beam is shaped to have a rectangular or ellipsoidal cross-section, and the thin film is irradiated in step (ii) by the elongated and shaped beam.

3. A laser zone melting method according to claim 2, wherein said laser beam has a higher energy density at its central portion than at its periphery, and the peak-to-peak amplitude of the oscillation in step (ii) is such that the high-energy portion of the beam will scan approximately the width of the thin film in the direction perpendicular to the moving direction.

4. A laser zone melting method according to claim 2 wherein the deflecting frequency of said laser beam is more than 1 Hz.

5. A laser zone melting method according to claim 4 wherein the power fluctuation of said laser beam is suppressed to less than 1% by measuring the temperature of melting zone in said thin film, holding a voltage corresponding to said temperature in an electronic circuit, comparing said voltage with a predetermined reference voltage, and feeding its difference voltage back to a power controller in a laser generator to control a laser power source.

6. A laser zone melting method according to claim 5 wherein said thin film is constituted by a semiconductor.

7. A laser zone melting method according to claim 6 wherein said semiconductor is InSb or Ga$_x$In$_{1-x}$Sb.

8. A laser zone melting method according to claim 5 wherein the thickness of said thin film is in the range of 100 Å to 100 $\mu m$.

9. A laser zone melting method according to claim 2, wherein the laser, in irradiating the thin film, has a power output of at least 1 W.

10. A laser zone melting method according to claim 5, wherein the thin film is made of a material selected from the group consisting of InSb, Si, and Ga$_x$In$_{1-x}$Sb.

11. A laser zone melting apparatus comprising a chamber defining a closed container, means for holding therein a thin film to be zone melted, a laser light source which generates a laser beam for irradiating said thin film, a laser power source for operating said laser light source, a power controller for controlling said power source, optical means for defining an optical path for introducing said laser beam from said laser light source to said thin film, means for deflecting oscillatorily said laser beam at a frequency of more than 1 Hz in a direction substantially perpendicular to the moving direction of melting zone of said thin film, means for relatively moving said thin film and said laser beam in a direction substantially perpendicular to the deflecting direction of said laser beam, and means for suppressing the power fluctuation of said laser light source to less than 1%.

12. A laser zone melting device comprising a chamber defining a closed container, means for holding therein a thin film to be zone melted, a laser light source which generates a laser beam to be irradiated on said thin film, an electric power source for operating said laser light source, a power controller for controlling said electric power source, optical means for defining an optical path for introducing said laser beam from said laser light source to said thin film, means for deflecting said laser beam oscillatorily at a frequency of more than 1 Hz in a direction substantially perpendicular to the moving direction of melting zone of said thin film, means for relatively moving said thin film and said laser beam in a direction substantially perpendicular to the deflecting direction of said laser beam, means for measuring the temperature of said melting zone in said thin film, means for holding a voltage corresponding to said temperature and comparing said voltage with a predetermined reference voltage to generate a difference voltage, and means for feeding said difference voltage back to said power controller so as to suppress laser beam power fluctuation.

13. A laser zone melting apparatus according to claim 11 wherein said laser light source is a CO$_2$ laser.

14. A laser zone melting apparatus according to claim 7, wherein said optical means includes means for enlarging said laser beam in the deflecting direction with a cross-sectional shape of a rectangle or an ellipsoid.

15. A laser zone melting apparatus according to claim 10, wherein said optical means further comprises at least one of a convex cylindrical lense and a concave cylindrical mirror.

16. A laser zone melting apparatus according to claim 14 wherein said means for enlarging said beam comprises a concave spherical mirror and a light screening plate.

17. A laser zone melting apparatus according to claim 15, wherein said optical means also comprises at least one of two convex spherical lenses and two concave spherical mirrors for enlarging the beam diameter.

18. A laser zone melting apparatus according to claim 16, wherein said optical means further comprises at least one of two convex spherical lenses and two concave spherical mirrors for enlarging the beam diameter.

19. A laser zone melting apparatus for zone melting a thin film by irradiating the thin film with a laser beam and moving the laser beam relative to the thin film, in a moving direction, comprising a chamber defining a closed container, means for holding therein a thin film to be zone melted, a laser light source which generates a laser beam to be irradiated on said thin film, optical means for defining an optical path for introducing said laser beam from said laser light source to said thin film, said optical means including means for elongating the laser beam in a direction substantially perpendicular to the moving direction of the melting zone of the thin film, means for deflecting oscillatorily said laser beam at a frequency of more than 1 Hz in the direction substantially perpendicular to the moving direction of the melting zone of the thin film, and means for moving said thin film relative to said laser beam, in the direction substantially perpendicular to the deflecting direction of the laser beam.

20. A laser zone melting apparatus according to claim 19, wherein said means for elongating also shapes the laser beam to have a rectangular or ellipsoidal cross-section.

* * * * *